(12) United States Patent
Wichert et al.

(10) Patent No.: US 8,796,972 B2
(45) Date of Patent: Aug. 5, 2014

(54) METHOD FOR STARTING AN ELECTRONIC DRIVE CIRCUIT OF AN ELECTRIC MOTOR AND CIRCUIT ARRANGEMENT THEREFOR

(75) Inventors: René Wichert, Durlangen (DE); Gernot Liebhard, Waiblingen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 17 days.

(21) Appl. No.: 13/438,478

(22) Filed: Apr. 3, 2012

(65) Prior Publication Data

US 2012/0249027 A1 Oct. 4, 2012

(30) Foreign Application Priority Data

Apr. 4, 2011 (DE) .......................... 10 2011 015 977

(51) Int. Cl.
*H02P 27/00* (2006.01)
(52) U.S. Cl.
USPC ... 318/400.3; 318/794; 318/430; 318/400.09; 318/101
(58) Field of Classification Search
USPC .................. 318/400.3, 400.03, 101, 400.09, 318/400.11, 400.21, 778, 794, 430
See application file for complete search history.

(56) References Cited

U.S. PATENT DOCUMENTS

| 2010/0001584 A1* | 1/2010 | Tabell ............................. 307/23 |
| 2011/0031922 A1* | 2/2011 | Sakai et al. .................... 318/519 |
| 2011/0069518 A1* | 3/2011 | Shin et al. ...................... 363/140 |
| 2011/0133546 A1* | 6/2011 | Jang et al. ...................... 307/9.1 |

* cited by examiner

*Primary Examiner* — Bentsu Ro
*Assistant Examiner* — Iftekhar Mustafa
(74) *Attorney, Agent, or Firm* — Walter Ottesen P.A.

(57) ABSTRACT

The invention relates to a method for starting an electronic drive circuit for the windings of an electric motor. A control unit, which is connected to a voltage source, is provided as well as a capacitor connected via a system switch element to the connecting terminals of the voltage source. The capacitor is connected across the input terminals parallel to the drive circuit. An operating circuit controls the system switch element. In order to start the motor, the operating circuit closes the system switch element and charges the capacitor and after the charging of the capacitor, opens the system switch element again. A test step is then started by the control unit, the drive circuit being supplied exclusively by the capacitor voltage ($U_C$) during the test step.

21 Claims, 4 Drawing Sheets

METHOD FOR STARTING AN ELECTRONIC DRIVE CIRCUIT OF AN ELECTRIC MOTOR AND CIRCUIT ARRANGEMENT THEREFOR

CROSS REFERENCE TO RELATED APPLICATION

This application claims priority of German patent application no. 10 2011 015 977.0, filed Apr. 4, 2011, the entire content of which is incorporated herein by reference.

FIELD OF THE INVENTION

The invention relates to a method for starting an electronic drive circuit for a stator winding of an electric motor and a circuit arrangement therefor.

BACKGROUND OF THE INVENTION

It is known to connect an electric motor such as an electronically commutated EC-motor or the like to a DC-voltage source via a control circuit or inverter, wherein the coil ends of the stator windings are each connected via a power switch to the one connecting terminal of the voltage source and via a further power switch to the other connecting terminal of the voltage source. The control unit switches the six power switches in such a manner that a rotating field results for the rotor in the stator of the motor and entrains the rotor.

In a handheld electric work apparatus, battery packs with high power density are used, that is, for example, battery packs with cells chemically based on lithium. Thus, multiple lithium-ion cells, lithium-polymer cells or similar cells are connected to each other in a battery pack in order to provide a battery pack having high output voltage and high capacity. If such a battery pack is connected to a defective drive circuit, high currents can already flow while the motor is being connected or switched on, and these high currents can damage the electronic circuit as well as the motor. Thus, it is expedient to check whether the electronics are functioning properly prior to applying the battery voltage, in order to protect the electronics per se and/or the motor.

SUMMARY OF THE INVENTION

It is an object of the invention to provide a method for starting an electronic drive circuit for the stator windings of an electric motor, in which the operability of the essential circuit elements is checked by simple means prior to the starting of the motor.

The method of the invention is for starting an electronic drive circuit for the windings of an electric motor, the drive circuit having input terminals and being a part of a circuit arrangement further including a voltage source having first and second connecting terminals; a control unit connected to the voltage source; a system switch element; a capacitor having a capacitor voltage ($U_C$) and being connected via the system switch element to the connecting terminals of the voltage source; the capacitor being connected to the input terminals parallel to the drive circuit; and, an operating circuit for the system switch element. The method includes the steps of: for starting the motor, closing the system switch element and charging the capacitor; opening the system switch element after charging the capacitor; causing the control unit to start a test step for the drive circuit; and, supplying the drive circuit exclusively from the capacitor voltage ($U_C$) during the test step.

The capacitor arranged on the side of the drive circuit on the input terminals thereof is configured in such a manner that it serves to eliminate voltage peaks and additionally serves as an intermediate energy storage medium. This intermediate energy storage medium is charged by the system switch element of the voltage source being closed, in order to then—when the capacitor is charged—open the system switch element again and thus disconnect the voltage source from the drive circuit again. Now a test cycle can be executed—only with the charge stored in the capacitor—with the drive circuit being supplied exclusively by the capacitor during the test cycle. This affords the advantage that, in the case of a system short circuit in the drive circuit, the energy flowing during a short circuit is limited by the charge stored in the capacitor. A short circuit current is limited in magnitude and in a manner temporally dependent on the capacity of the capacitor used. Thus, damage to the electronics as well as damage to the motor itself or to the battery pack can be avoided.

Advantageously, the capacitor voltage is monitored by the control unit, the capacitor voltage being an indicator of whether the system is operating in a fault free manner or has faults. Thus, the capacitor voltage will change or remain constant in response to the test during the execution of a test step; in this manner, in dependence on the test step carried out and the behavior of the capacitor voltage, an evaluation can be made as to whether the test step was performed in a fault free manner or had faults.

Thus, after the opening of the system switch element in a test step, the capacitor can be connected to a load in order to determine whether the capacitor voltage drops or remains constant in response. If the capacitor voltage drops, the system switch opened properly and is thus fault free. If, however, the capacitor voltage remains approximately constant, this is an indication that the system switch element did not open properly and the capacitor can therefore be permanently recharged by the voltage source. The system switch element contains faults, since it did not open properly.

In a further test step, a power switch of a branch of the drive circuit is closed, the second power switch in this branch remaining open. Since the input terminals of the drive circuit are short circuited with each other via the two closed power switches of a branch, the capacitor would discharge—if the open power switch has continuity—and the capacitor voltage would thus drop. A falling capacitor voltage after closing only one power switch in a branch of the drive circuit thus indicates that the other power switch in the branch is open with faults. If, however, the capacitor voltage remains constant, the open power switch is fault free because it keeps the branch open properly.

Because it is sufficient for this test step to determine whether one of the power switches of the three branches present contains faults, it is expedient for all power switches connected to a connecting terminal to be closed at the same time in a test step. In this way, all power switches of the high side can be closed simultaneously in order to check whether the open power switches of the low side are working in a fault free manner. Correspondingly, in a further test step, all power switches of the low side are closed and the power switches of the high side are switched open. If the capacitor voltage remains for the most part constant, the power switches of the high side open in a fault free manner.

These initial test steps form a basic test cycle, after the fault free execution of which, it is ensured that both the system switch elements and the power switches of the drive circuit open properly. Now, in a further test cycle, a test voltage derived from the capacitor voltage can be applied to in each case one stator winding without generating torque and the current or current course which increases over time can be evaluated. Thus, in a preferred embodiment, the slope of the current increase over time is determined and the inductivity of the stator windings supplied with current is calculated according to the equation $U_L=L*di/dt$. To eliminate an offset, it is provided that while current is flowing between two nodes, the slope of the current increase is determined multiple times and the inductivity is computed multiple times. From the values obtained, the mean value of the inductivity is then determined.

It can be expedient to monitor the status of the current curve. If there is a current curve which increases over time within a predetermined corridor, the stator winding which is switched on is connected in a fault free manner. If, however, the current curve runs out of the corridor, the connection of the stator winding is defective.

Expediently, the voltage applied in a test step is not the capacitor voltage itself but a test voltage which is a pulsewidth modulated signal derived from the capacitor voltage. The pulsewidth is set in such a manner that a mean effective test voltage that is suitable for the test step results. As a result, the same mean effective test voltage that is independent of the charge state of the capacitor can be provided. In order to always start from a defined starting condition at the beginning of the test, it is provided that the control unit switches the drive circuit into a starting position, that is a reset is performed, before the closing of the system switch element.

A circuit arrangement for executing the method described above includes: an electronic drive circuit for electrically operating a motor; a voltage source having connecting terminals; the drive circuit having input terminals connected to the voltage source; a capacitor connected to the connecting terminals of the voltage source; a system switch element arranged between one of the connecting terminals of the voltage source and the capacitor; an operating circuit for actuating the system switch element; a control unit for starting a test step for the drive circuit; the capacitor being adapted to hold energy required for carrying out the test step; and, means for causing the energy to be supplied to the input terminals of the drive circuit exclusively from the capacitor during a test cycle.

A system switch element which is actuated by an operating switch is arranged between a terminal of the voltage source and the capacitor. The electrical energy supplied to the input terminals of the drive circuit during a test cycle is supplied exclusively by the capacitor. Therefore, it is ensured that, in the case of a short circuit, a limited short circuit current occurs which is also determined by the maximum capacity of the capacitor.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
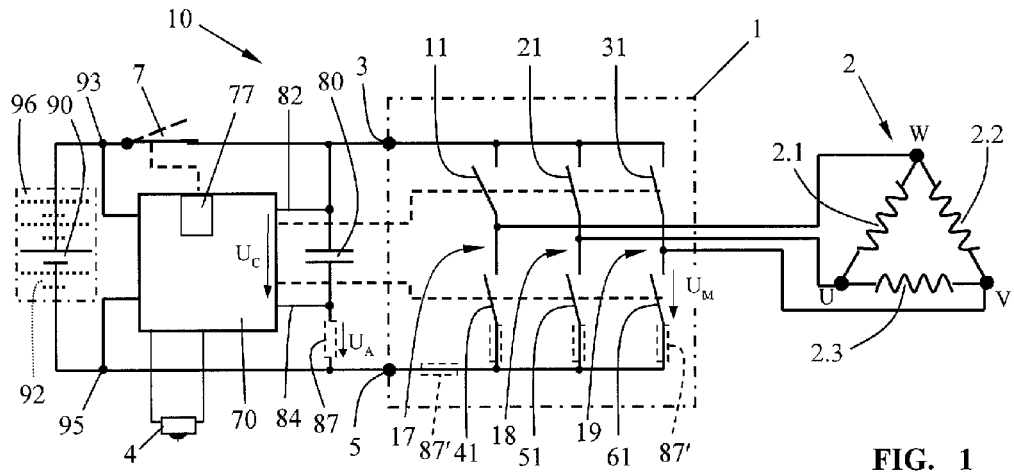
FIG. 1 is a schematic view of a circuit arrangement with an electronic drive circuit to control an electric motor.

The circuit arrangement 10 schematically shown in FIG. 1 serves to start an electronic drive circuit 1 for the stator windings 2.1, 2.2 and 2.3 of an electric motor 2. In the exemplary embodiment shown, the electric motor is an electronically commutated motor, a so-called EC-motor with windings 2.1, 2.2 and 2.3, in particular the windings of the stator, connected in a delta connection. Alternatively, a star connection of the windings is possible. The drive circuit 1 is also suitable in a corresponding manner for driving direct current motors, synchronous motors, asynchronous motors or the like.

The drive circuit 1 is connected to the connecting terminals 93 and 95 of a voltage source 90 by way of its input terminals 3 and 5. The voltage source 90 is a direct current source, the voltage of which is transmitted further by the drive circuit 1 as a pulsewidth modulated signal. A capacitor 80 for cancelling voltage peaks, especially an electrolytic capacitor, is connected in parallel to the drive circuit 1 at its input terminals 3 and 5. The capacitor 80 further forms an energy store for a test operation. A system switch element 7 is provided between the input terminal 3 and the connecting terminal 93, and the entire arrangement can be connected to the voltage of the voltage source 90 or can be separated therefrom via the system switch element 7. The capacitor 80 is at the end of the drive circuit 1, that is, the capacitor 80 is connected to the connecting terminal 93 via the system switch element 7.

In the embodiment shown, the voltage source 90 is a direct-current source and is especially a battery block 96 made up of individual cells 92 which are preferably connected in series. The individual cells 92 are especially cells chemically based on lithium, for example, lithium-ion cells, lithium-polymer cells, lithium-iron cells or the like. Because of the series circuit, a battery block voltage of approximately 18 volt to 80 volt, especially approximately 36 volt, can be made available.

The system switch element 7 of the circuit arrangement 10 is controlled by an operating circuit 77 which can be part of a control unit 70 or be integrated thereinto. An operating switch 4 is connected to the control unit 70 and is pressed by a user for starting the motor 2.

The capacitor voltage $U_C$ of the capacitor 80 is tapped via measurement leads (82, 84) so that the capacitor voltage $U_C$ is available to the control unit 70 at all times for evaluation.

In the exemplary embodiment of FIG. 1, a shunt resistor 87 can additionally be provided in the capacitor branch, the voltage $U_A$ of the shunt resistor 87 being detected by the control unit 70 via the measurement lead 84 relative to ground. The charging current and discharging current of the capacitor can be detected via the shunt resistor 87. Correspondingly, a shunt resistor 87' can be provided in the branch of a switch element or in the branch of the input terminal 5, as shown by way of dashed lines in FIG. 1. By detecting the voltage $U_M$ that drops across the inner resistor of a closed power switch, the flowing current or the course of the current over time can be detected in the branch.

The control unit 70 serves to control power switches (11, 21, 31, 41, 51, 61) via which the nodes (U, V, W) of the delta circuit of the stator windings (2.1, 2.2, 2.3) can be connected to the voltage source 90. Each node is connected via a power switch (11, 21, 31) to the one connecting terminal 93 of the voltage source 90, the voltage source 90 forming the high side in the exemplary embodiment shown. Correspondingly, each node (U, V, W) is connected to connecting terminal 95 via a power switch (41, 51, 61), the connecting terminal 95 forming the low side of the voltage supply. Since in each case two coil ends of the stator windings are connected into the nodes (U, V, W), each coil end is connected to the high side of the voltage source (connecting terminal 93) as well as to the low side of the voltage source (connecting terminal 95) via the power switches 11 to 61. The power switches are driven by control unit 70 which is indicated in FIG. 1 by dashed lines. The arrangement of the power switches takes place in parallel branches which connect the input terminals (3, 5) to each other. In a first branch 17, the power switches 11 and 41 are in series; in a second branch 18, the power switches 21 and 51 are in series and, in a third branch 19, the power switches 31 and 61 are in series.

In order to start the motor 2, the user presses, for example, the operating switch 4 so that the control unit 70 receives a prompt signal for switching on the motor 2. Before the motor 2 is started, a test cycle is started by the control unit 70, the test cycle checking that both the system switch element 7 and the power switches 11 to 61 are operating properly. If the check of the system switch element and the power switches is completed, the proper condition of the stator windings and their circuitry is checked. Only when this check has likewise been completed positively, is the motor 2 started by correspondingly providing current to the stator windings (2.1, 2.2, 2.3).

The individual test steps of the test cycle run as follows:

When the control unit 70 receives a prompt signal for starting the motor 2 via the operating switch 4, the drive circuit 1 is first brought into a start position, that is, the drive circuit 1 is reset. All power switches 11 to 61 are open. The system switch 7 is open as shown in FIG. 1 by dashed lines. Since the control unit 70 is connected directly to the connecting terminals 93 and 95 of the voltage source 90, the control unit 70 is also operationally ready when the system switch element 7 is open.

After the drive circuit 1 has been reset, the system switch element 7 is closed via the operating circuit 77 for a pregiven time span, as a result of which the capacitor 80 is charged. No current flows through the motor 2 because all power switches 11 to 61 are open.

The charging of the capacitor 80 can be time controlled, that is, the operating circuit 77 closes the system switch element 7 for a pregiven time span and then opens the same again. It can also be expedient to monitor the voltage increase of the capacitor voltage $U_C$ via the control unit 70 and, after reaching a pregiven threshold value of the capacitor voltage $U_C$, then to open the system switch element 7 again via the operating circuit 77. Once the capacitor 80 is charged, adequate electrical energy is available for a follow-on test cycle which is fed in by the capacitor 80 via the input terminals 3 and 5. After processing a first section of the test cycle, it can be expedient to recharge the capacitor 80 again to a desired capacitor voltage $U_C$ via a renewed controlled closing of the system switch element 7.

Figure 2:
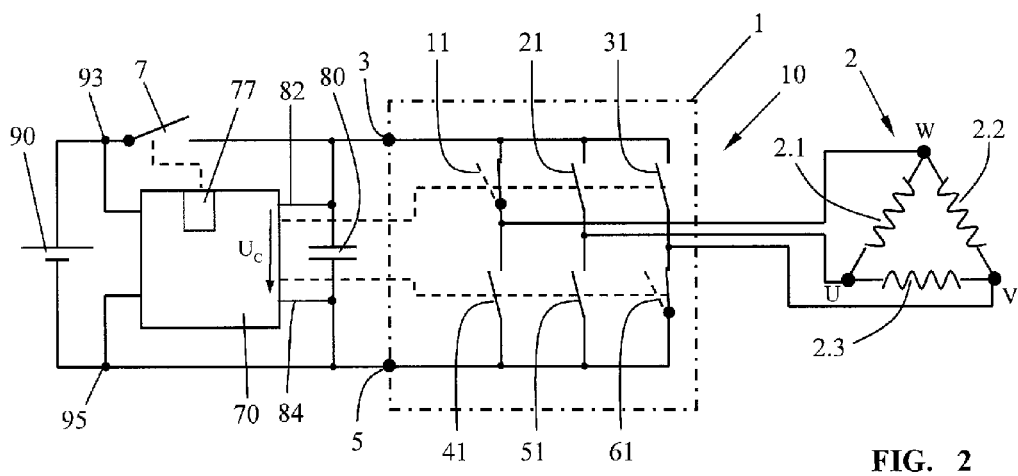
FIG. 2 shows the circuit arrangement of FIG. 1 in a first test step of a test cycle for testing the system switch element.

When the capacitor 80 is charged, a check is first of all made in a first test step as to whether the system switch element 7 has opened properly. This is checked by applying a load to the capacitor 80 as shown in FIG. 2. By closing the power switches 11 and 61, the nodes W and V are switched onto the input terminals 3 and 5 so that capacitor 80 can be discharged via this switched electrical connection without the rotor moving. The control unit 70 monitors the capacitor voltage $U_C$ after closing of the power switches 11 and 61; when the capacitor voltage $U_C$ drops off, i.e. the charge in the capacitor 80 reduces, the system switch element 7 is opened. The system switch element is fault free and the test cycle can be continued.

If, in contrast, the capacitor voltage $U_C$ is approximately constant, this is an indication that the system switch element 7 has not opened properly and the connecting terminal 93 continues to be connected to the capacitor 80. The capacitor 80 cannot discharge via the voltage source 90 even when there is a load caused by the stator windings. An approximately constant capacitor voltage $U_C$ is therefore an indication for a fault in the system switch element 7. The test cycle is then interrupted and a fault is displayed.

If, in the first test step, a falling capacitor voltage is determined with the capacitor 80 loaded with a load, the system switch element is fault free and a next test step is initiated. This next test step is shown in FIG. 3.

Figure 3:
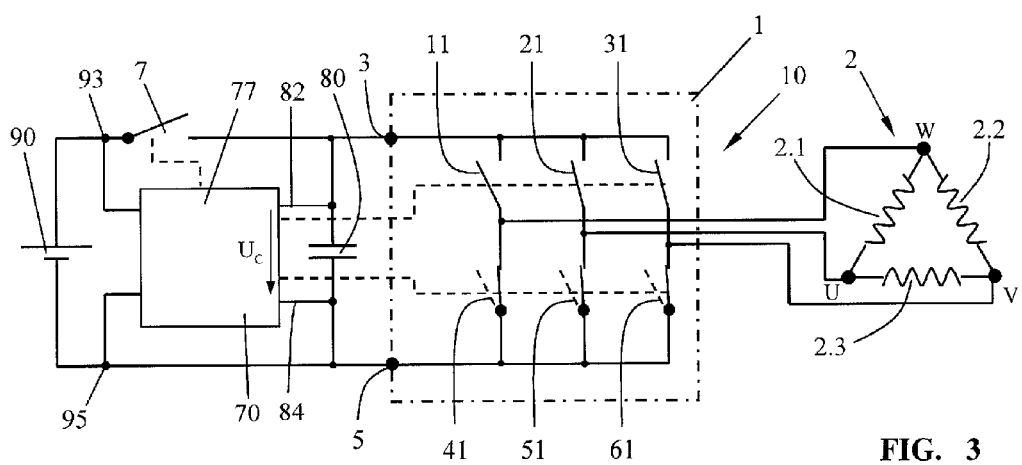
FIG. 3 shows the circuit arrangement of FIG. 1 in a second test step for testing the open position of the high side power switch.

The control unit 70 monitors furthermore the capacitor voltage $U_C$ and closes—sequentially or simultaneously—the power switch connected to an input terminal 5, in the exemplary embodiment of FIG. 3, all low side power switches 41, 51 and 61. In contrast, the high side power switches 11, 21 and 31 are switched open. If the capacitor voltage $U_C$ does not change in this switch state, then the high side power switches 11, 21 and 31 have opened properly. If, in contrast, the capacitor voltage $U_C$ drops, one of the power switches 11, 21 or 31 of the high side is defective because, in the open state, an impermissible current flows.

Since, in this test step, it is only important to determine whether all power switches of the high side 11, 21 and 31 open properly, the test step can be carried out by a simultaneous closing of all low side power switches 41, 51 and 61. If the capacitor voltage drops, the conclusion can be drawn that one of the high side power switches is defective. Should it be determined which one of the high side power switches is defective, only one power switch of the low side can be closed in a branch (17, 18, 19); if a current flows and therefore the capacitor voltage drops, the power switch of the high side which is open in the same branch (17, 18, 19) is defective. In this way, a detection of the defective power switch is possible.

Figure 4:
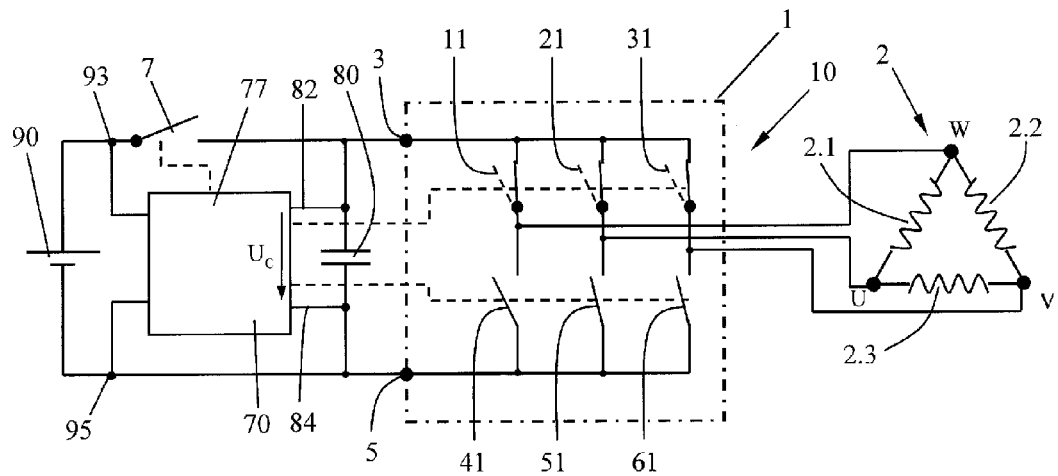
FIG. 4 shows the circuit arrangement of FIG. 1 in a third test step for testing the open position of the low side power switches.

In the exemplary embodiment of FIG. 4, a test is made in a manner corresponding to the exemplary embodiment of FIG. 3 as to whether the low side power switches 41, 51 and 61 open properly. For this purpose, the high side power switches (11, 21, 31) are closed and, if the capacitor voltage drops, a determination is made that at least one low side power switch has continuity even though it is switched open. The result is evaluated as a fault and is correspondingly displayed. If, in contrast, the capacitor voltage $U_C$ remains substantially constant, then all three low side power switches (41, 51, 61) have opened properly. The test step is terminated without fault.

After, on the one hand, the proper opening of the system switch element 7 and, on the other hand, the proper opening of the power switches 11, 21, 31, 41, 51 and 61 has been determined, the circuit arrangement 10 could be started. The electronics of the switching arrangement, namely the system switch element 7 and the power switches 11 to 61, open properly.

Advantageously, in an expanded test cycle, a determination is also made as to whether the stator windings 2.1, 2.2 and 2.3 are properly connected, have no short circuits with respect to each other or are otherwise defective. For this purpose, and in a manner corresponding to the test steps of FIGS. 5 to 10, each individual switch position of an operating state of the drive circuit 1 is checked out. In the exemplary embodiment shown, there are six switch positions corresponding to the further switching of the rotating field for an electronically commutated motor in 60° steps.

Figure 5:
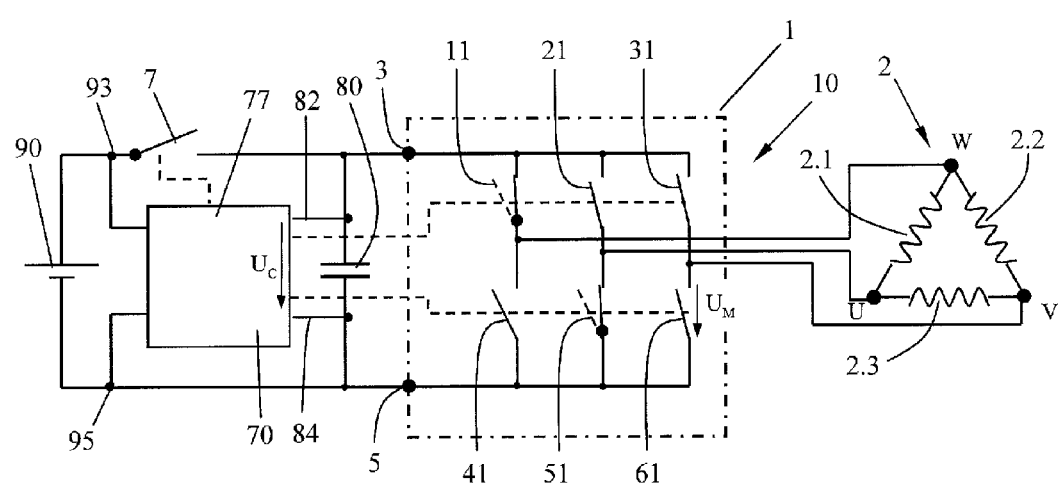
FIG. 5 shows the circuit arrangement in a fourth test step of a test cycle for testing whether a first stator winding is properly connected.
Figure 6:
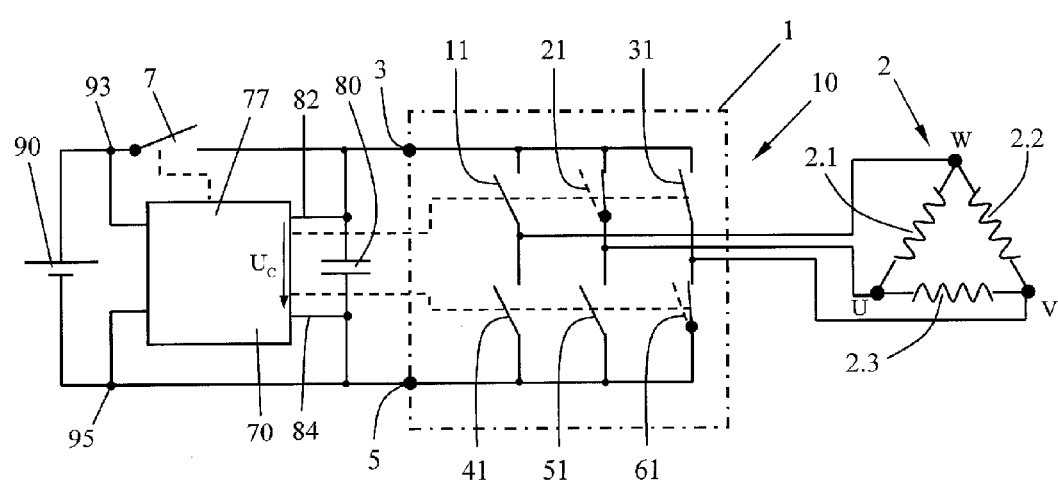
FIGS. 6 to 10 show the circuit arrangement of FIG. 5 in further test steps of a test cycle for testing whether the further stator windings are properly connected in all possible operating states; and, FIG. 11 is a schematic view of the course of the current in a winding applied over time after the application of a test voltage.
Figure 7:
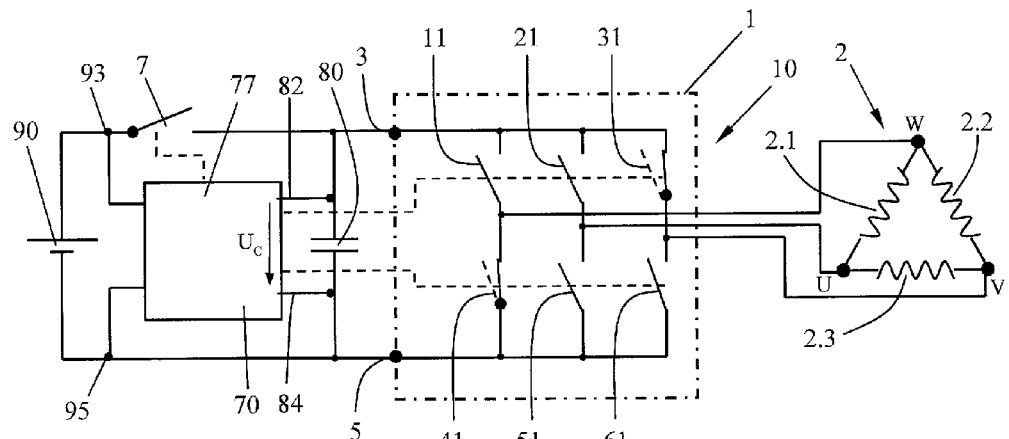
Figure 8:
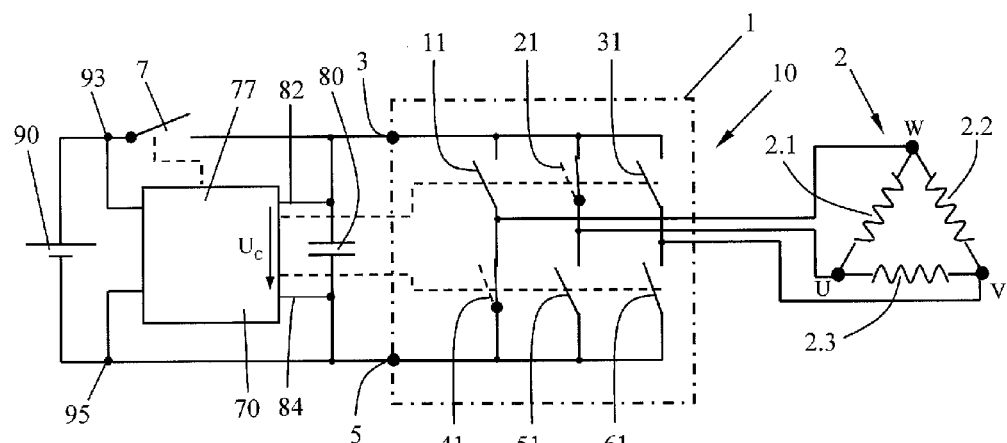
Figure 9:
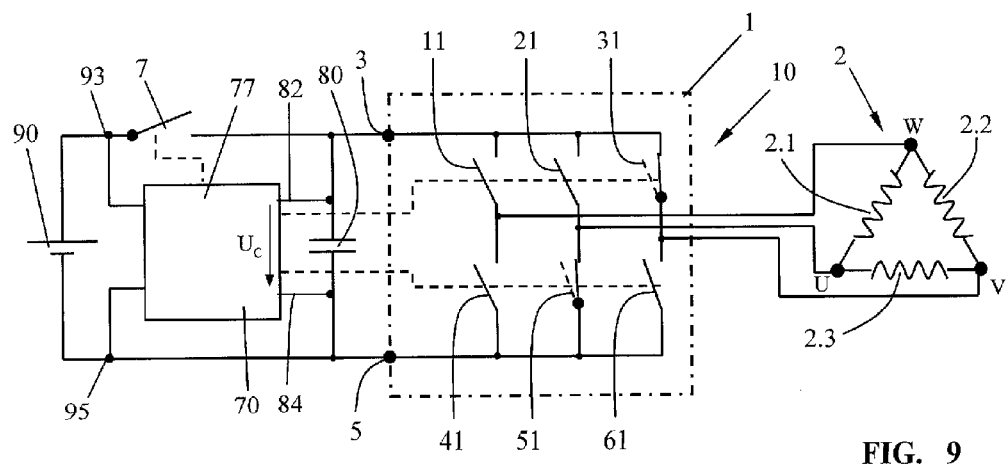
Figure 10:
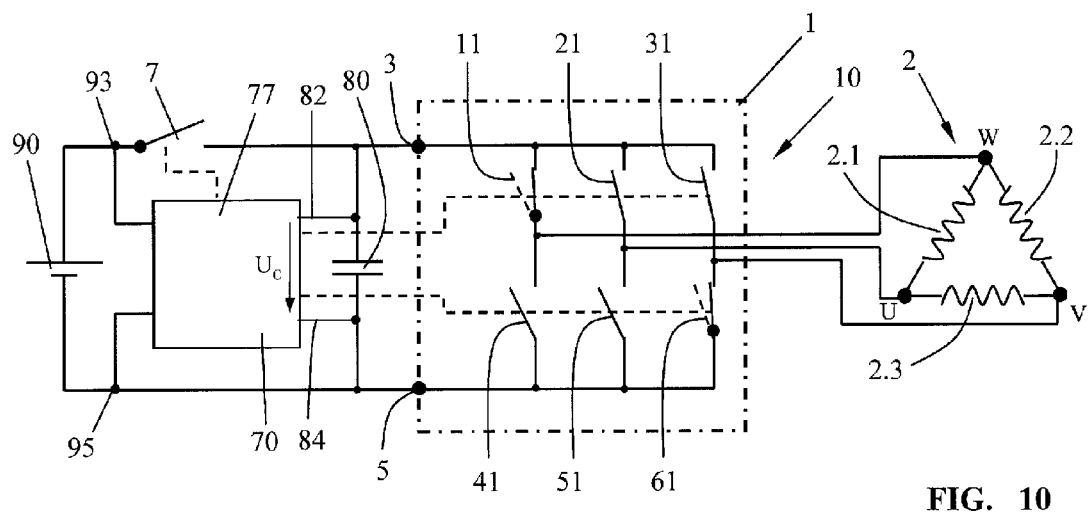

In FIG. 5, the power switches 11 and 51 are closed, as a result of which the capacitor voltage is applied between the nodes W and U. In FIG. 6, the capacitor voltage lies between the nodes U and V. In FIG. 7, the capacitor voltage lies between the nodes V and W. In FIG. 8, the capacitor voltage lies between the nodes U and W. In FIG. 9, the capacitor voltage lies between the nodes V and U, and in FIG. 10, the capacitor voltage lies between the nodes W and V.

Figure 11:
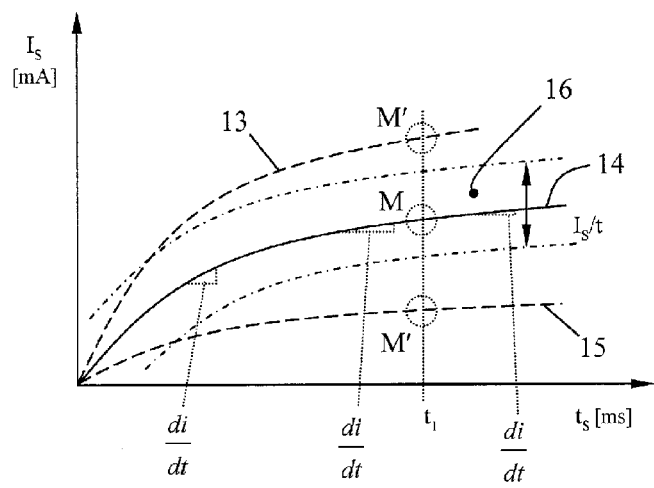

In order to determine whether a proper connection of a stator winding 2.1, 2.2 or 2.3 is present, the increase in the coil current $I_S$ is measured, this being shown schematically in FIG. 11. The detection of the coil current $I_S$ is possible in a simple manner via the evaluation of the current $U_M$, which drops across the inner resistor of a closed power switch, as is shown in FIG. 1 or FIG. 5 with respect to the example of the power switch 61. In the same manner, the coil current $I_S$ as a function of time t can be computed by tapping the voltage $U_A$ at a shunt resistor 87 or 87' (FIG. 1).

As soon as the power switches for supplying current to a node pair are closed, a current will build up in a manner corresponding to a curve 14, as shown schematically in FIG. 11, as long as the power switches close properly. Here, the supply of current is configured such that the rotor does not move; the rotor is at a standstill. A proper condition is present when the detected course of the curve 14, that is, the current increase, lies within a pregiven corridor 16; the corresponding operating position of the drive circuit 1 operates in a fault free manner. If, in contrast, the curve is too flat, as shown by the example of curve 15, or is too steep, as shown by the example of curve 13, there is a movement out of the corridor 16 and the control unit 70 can detect a defective condition. In a simple manner, at a time point $t_1$, the instantaneous value M can be determined. If the instantaneous value lies within the corridor 16, the system is operating without fault; if the instantaneous value M' lies outside of the corridor 16, the work condition is defective.

Alternatively, as a test step, a determination of the inductance L of the current-supplied stator windings 2.1, 2.2 or 2.3 is possible by measuring the current increase di as a function of time dt. According to the equation $U_L = L*di/dt$, the particular inductance between the nodes V, U and W is easily determinable to establish whether proper operating conditions are present. If, during a current feed between nodes, the developing current increase is determined multiple times, then a mean inductance can be computed from the values obtained so that a possible offset influence can be eliminated.

Since energy is drawn off from the capacitor 80 in the course of the different test steps, the voltage $U_C$ thereof drops; in order to apply always the same test voltage when testing the inductance L between the particular nodes, it is provided that a pulsewidth modulated signal is derived as test voltage from the capacitor voltage $U_C$, the pulsewidth being set depending on the capacitor voltage $U_C$ such that the same average effective test voltage is always present. Independently of the charging state of the capacitor 80, a constant effective test voltage can thus be made available.

In the exemplary embodiments shown, the system switch element and the power switches 11 to 61 are shown schematically. These elements are expediently electronic switch elements, especially MOSFETs, thyristors or the like.

The capacitor 80 is expediently designed such that a complete charge of the capacitor is sufficient in order to make available both the energy which is required for the basic cycle and also the energy required for the expanded test cycle. The energy of the charged capacitor is also adequate because an individual test step is present only in the range of milliseconds, for example, in the range of 1 to 10 milliseconds. Because of these short time spans, it is ensured that, during the test cycle, the rotor of the motor does not rotate. All individual test steps therefore take place with the rotor at a standstill.

The energy of the capacitor 80 is also adequate because in each test step of the test cycle, the capacitor voltage $U_C$ is expediently fed in as a pulsewidth modulated test voltage so that the currents and voltages in each test step can be pregiven or set.

It is understood that the foregoing description is that of the preferred embodiments of the invention and that various changes and modifications may be made thereto without departing from the spirit and scope of the invention as defined in the appended claims.

What is claimed is:

1. A method for starting an electronic drive circuit for the windings of an electric motor, said drive circuit having input terminals and being a part of a circuit arrangement further including a voltage source having first and second connecting terminals and a system switching element connecting said drive circuit to said voltage source; a control unit connected to said voltage source; a capacitor having a capacitor voltage ($U_C$) and being connected via said system switching element to said connecting terminals of said voltage source; said capacitor being connected to said input terminals parallel to said drive circuit; and, an operating circuit for said system switching element; the method comprising the steps of:

in advance of starting said motor, closing said system switching element for a pregiven time interval and charging said capacitor via said system switching element;

causing said operating circuit to open said system switching element after said capacitor is charged thereby disconnecting said capacitor and said drive circuit from said voltage source;

after said capacitor is disconnected from said voltage source, causing said control unit to start a test step for said drive circuit; and, during said test step, supplying said drive circuit exclusively from said capacitor voltage ($U_C$) of said capacitor disconnected from said voltage source with said capacitor being configured and charged so that said capacitor can store the energy needed for said test step and make said energy available during said test step.

2. The method of claim 1, wherein said test step is a test step of a test cycle having a plurality of test steps; and, wherein the method further comprises:

causing said control unit to monitor said capacitor voltage ($U_C$); and, making a decision of whether the executed test step of the test cycle is fault free or defective based on a change of said capacitor voltage ($U_C$) during one of said test steps of said test cycle in dependence upon the executed test step.

3. The method of claim 2, the method comprising the further steps of:

after opening said system switching element in one of said test steps, applying a load to said capacitor;

if said capacitor voltage ($U_C$) drops off, evaluating said system switching element as being free of fault; and, if said capacitor voltage ($U_C$) is approximately constant, evaluating said system switching element as being defective.

4. A method for starting an electronic drive circuit for the windings of an electric motor, said drive circuit having input terminals and being a part of a circuit arrangement further including a voltage source having first and second connecting terminals and a system switching element; each of said windings having first and second coil ends and said drive circuit including a first plurality of power switches connecting corresponding ones of said first coil ends to said first connecting terminal of said voltage source and a second plurality of power switches connecting corresponding ones of said second coil ends to said second connecting terminal of said voltage source; a control unit connected to said voltage source; a capacitor having a capacitor voltage ($U_C$) and being connected via said system switching element to said connecting terminals of said voltage source; said capacitor being connected to said input terminals parallel to said drive circuit; and, an operating circuit for said system switching element; the method comprising the steps of:

for starting said motor, closing said system switching element and charging said capacitor;
opening said system switching element after charging said capacitor;
causing said control unit to start a test step for said drive circuit;
supplying said drive circuit exclusively from said capacitor voltage ($U_C$) during said test step; and,
said test step being a test step of a test cycle having a plurality of test steps;
causing said control unit to monitor said capacitor voltage ($U_C$);
making a decision of whether the executed test step of the test cycle is fault free or defective based on a change of said capacitor voltage ($U_C$) during one of said test steps of said test cycle in dependence upon the executed test step;
after opening said system switching element in one of said test steps, applying a load to said capacitor;
if said capacitor voltage ($U_C$) drops off, evaluating said system switching element as being free of fault; and,
if said capacitor voltage ($U_C$) is approximately constant, evaluating said system switching element as being defective;
in one of said test steps, closing at least one of said power switches of said first plurality;
holding open all of the power switches of said second plurality of power switches; and,
evaluating said capacitor voltage ($U_C$).

5. The method of claim 4, wherein at least one of the power switches of said second plurality of power switches is evaluated as being defective when said capacitor voltage ($U_C$) drops off; and, the power switches of said second plurality of power switches are evaluated as being fault free when said capacitor voltage ($U_C$) is approximately constant.

6. The method of claim 5, wherein all of said power switches of said first plurality of power switches in said test step are closed simultaneously.

7. The method of claim 6, wherein said motor has a rotor and in one of said test steps, a test voltage is tapped from said capacitor voltage ($U_C$) and is applied to one of said windings; and, the current ($I_S$), which increases as a function of time (t) with said rotor at standstill, is measured and evaluated by said control unit.

8. The method of claim 7, wherein the current increase (di/dt) is determined as a function of time; and, the inductance (L) is computed in accordance with the equation $U_L = L \cdot di/dt$.

9. The method of claim 8, wherein the current increase (di/dt) is determined multiple times while current is supplied; and, the inductance (L) is computed and a mean value of the inductance (L) is determined.

10. The method of claim 7, wherein said current defines a curve, and when said curve lies within a pregiven corridor the corresponding winding is evaluated as being fault free; and, when said curve lies outside of said pregiven corridor, the corresponding winding is evaluated as being defective.

11. The method of claim 7, wherein said test voltage is a pulsewidth modulated signal derived from said capacitor voltage ($U_C$).

12. A method for starting an electronic drive circuit for the windings of an electric motor, said drive circuit having input terminals and being a part of a circuit arrangement further including a voltage source having first and second connecting terminals and a system switching element; a control unit connected to said voltage source; a capacitor having a capacitor voltage ($U_C$) and being connected via said system switching element to said connecting terminals of said voltage source; said capacitor being connected to said input terminals parallel to said drive circuit; and, an operating circuit for said system switching element; the method comprising the steps of:

for starting said motor, closing said system switching element and charging said capacitor;
opening said system switching element after charging said capacitor;
causing said control unit to start a test step for said drive circuit;
supplying said drive circuit exclusively from said capacitor voltage ($U_C$) during said test step; and,
said test step being a test step of a test cycle having a plurality of test steps;
in a first one of said test steps, checking the operation of said system element;
in a second one of said test steps, checking the connection to chassis ground of one of said power switches; and,
in a third one of said test steps, checking the proper connection of said windings.

13. The method of claim 1, wherein said control unit switches said drive circuit into a defined start position before said system switching element is closed.

14. A circuit arrangement comprising:
an electronic drive circuit for electrically operating a motor;
a voltage source having connecting terminals;
said drive circuit having input terminals connected to corresponding ones of said connecting terminals of said voltage source;
a capacitor connected to said connecting terminals of said voltage source parallel to said input terminals of said drive circuit;
a system switch element arranged between one of the connecting terminals of said voltage source and one of said input terminals of said drive circuit and said capacitor;
an operating circuit for actuating said system switch element;
a control unit for starting a test step for said drive circuit;
said capacitor being adapted to hold energy required for carrying out said test step; and,
means for causing said energy to be supplied to said input terminals of said drive circuit exclusively from said capacitor during a test cycle.

15. The circuit arrangement of claim 14, wherein said operating circuit closes said system switch element for a first predetermined time span.

16. The circuit arrangement of claim 15, wherein said system switch element is an electronic switch element.

17. The circuit arrangement of claim 16, wherein said electronic switch element is a MOSFET.

18. The circuit arrangement of claim 14, wherein said capacitor is an electrolytic capacitor.

19. The circuit arrangement of claim 14, wherein said voltage source is a dc voltage source.

20. The circuit arrangement of claim 19, wherein said dc voltage source is a battery block comprising chemical cells based on lithium.

21. The circuit arrangement of claim 20, wherein said capacitor is disposed outside of said battery block.

* * * * *